United States Patent
Debroy et al.

(10) Patent No.: US 12,211,536 B1
(45) Date of Patent: Jan. 28, 2025

(54) SYSTEM AND METHOD FOR NANOMAGNET BASED LOGIC DEVICE

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: CEREMORPHIC, INC., San Jose, CA (US)

( * ) Notice: Subject to any disclaimer, the term of this patent is extended or adjusted under 35 U.S.C. 154(b) by 107 days.

(21) Appl. No.: 17/878,022

(22) Filed: Jul. 31, 2022

(51) Int. Cl.
*H01L 43/02* (2006.01)
*G11C 11/16* (2006.01)
*G11C 11/18* (2006.01)
*H10N 97/00* (2023.01)

(52) U.S. Cl.
CPC ........ *G11C 11/161* (2013.01); *G11C 11/1675* (2013.01); *G11C 11/18* (2013.01); *H10N 97/00* (2023.02); *H01L 2924/1431* (2013.01)

(58) Field of Classification Search
CPC ... G11C 11/18; G11C 11/161; G11C 11/1675; H01L 2924/1431; H10N 97/00
See application file for complete search history.

(56) References Cited

U.S. PATENT DOCUMENTS

| | | | |
|---|---|---|---|
| 8,134,441 B1 * | 3/2012 | Bokor | B82Y 25/00 335/304 |
| 9,391,262 B1 * | 7/2016 | Nikonov | G11C 11/1673 |
| 10,447,277 B1 * | 10/2019 | Kazemi | H10N 50/80 |
| 11,112,468 B2 * | 9/2021 | Braganca | G01R 33/0041 |
| 11,700,001 B1 * | 7/2023 | Debroy | H03K 19/18 326/104 |
| 2014/0022036 A1 * | 1/2014 | Lambson | H01F 1/0036 977/775 |
| 2015/0341036 A1 * | 11/2015 | Manipatruni | H01F 10/3268 326/101 |

* cited by examiner

*Primary Examiner* — Kurtis R Bahr
(74) *Attorney, Agent, or Firm* — MINISANDRAM LAW FIRM; Raghunath S. Minisandram

(57) ABSTRACT

A system and method for a logic device is disclosed. A plurality of substrates are provided. At least one input nanomagnet is disposed over each of the plurality of substrates. The plurality of input nanomagnets are disposed substantially equidistant from each other. The plurality of input nanomagnets are each a single domain nanomagnet. A spacer layer is disposed over the plurality of input nanomagnets. An output magnet is disposed over the spacer layer.

18 Claims, 8 Drawing Sheets

300

| | 302 INPUT A B C D E | 304 OUTPUT Z | 306 LOGIC TYPE |
|---|---|---|---|
| 308 | 00000 | 1 | NAND |
| 310 | 00001 | 1 | |
| 312 | 00010 | 1 | |
| 314 | 00011 | 1 | |
| 316 | 00100 | 1 | |
| 318 | 00101 | 1 | |
| 320 | 00110 | 1 | |
| 322 | 00111 | 0 | |
| 324 | 01000 | 1 | |
| 326 | 01001 | 1 | |
| 328 | 01010 | 1 | |
| 330 | 01011 | 0 | |
| 332 | 01100 | 1 | |
| 334 | 01101 | 0 | |
| 336 | 01110 | 0 | |
| 338 | 10000 | 1 | |

FIGURE 3A

|  | INPUT<br>A B C D E | OUTPUT<br>Z | LOGIC TYPE |
|---|---|---|---|
| 358 | 01111 | 0 | NOR |
| 360 | 10001 | 1 | |
| 362 | 10010 | 1 | |
| 364 | 10011 | 0 | |
| 366 | 10100 | 1 | |
| 368 | 10101 | 0 | |
| 370 | 10110 | 0 | |
| 372 | 10111 | 0 | |
| 374 | 11000 | 1 | |
| 376 | 11001 | 0 | |
| 378 | 11010 | 0 | |
| 380 | 11011 | 0 | |
| 382 | 11100 | 0 | |
| 384 | 11101 | 0 | |
| 386 | 11110 | 0 | |
| 388 | 11111 | 0 | |

FIGURE 3B

SYSTEM AND METHOD FOR NANOMAGNET BASED LOGIC DEVICE

RELATED APPLICATION

None

TECHNICAL FIELD

The present invention relates generally to logic devices and more specifically, to nanomagnet based logic devices.

DESCRIPTION OF RELATED ART

The complementary metal-oxide semiconductor (CMOS) technology based logic devices are reaching their physical limits in terms of reliability and power consumption in current day application. Further, continued requirement for minimal power consumption in computing devices configured to use these logic devices and utilization of semiconductor technology to construct these logic devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A plurality of substrates are provided. At least one input nanomagnet is disposed over each of the plurality of substrates. The plurality of input nanomagnets are disposed substantially equidistant from each other. The plurality of input nanomagnets are each a single domain nanomagnet. A spacer layer is disposed over the plurality of input nanomagnets. An output magnet is disposed over the spacer layer.

In another embodiment, a logic device is disclosed. A plurality of substrates are provided. At least one input nanomagnet is disposed over each of the plurality of substrates. The plurality of input nanomagnets are disposed substantially equidistant from each other. The plurality of input nanomagnets are each a single domain nanomagnet. A spacer layer is disposed over the plurality of input nanomagnets. An output magnet is disposed over the spacer layer.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIG. 3A shows an example table, showing various inputs to the logic device and corresponding outputs of the logic device implemented as a NAND logic, according to one aspect of the present disclosure;

FIG. 3B shows an example table, showing various inputs to the logic device and corresponding outputs of the logic device implemented as a NOR logic, according to one aspect of the present disclosure;

DETAILED DESCRIPTION

To facilitate an understanding of the adaptive aspects of the present disclosure, an example logic device will be described. The specific construction and operation of the adaptive aspects of various elements of the example logic device is also described.

Figure 1:
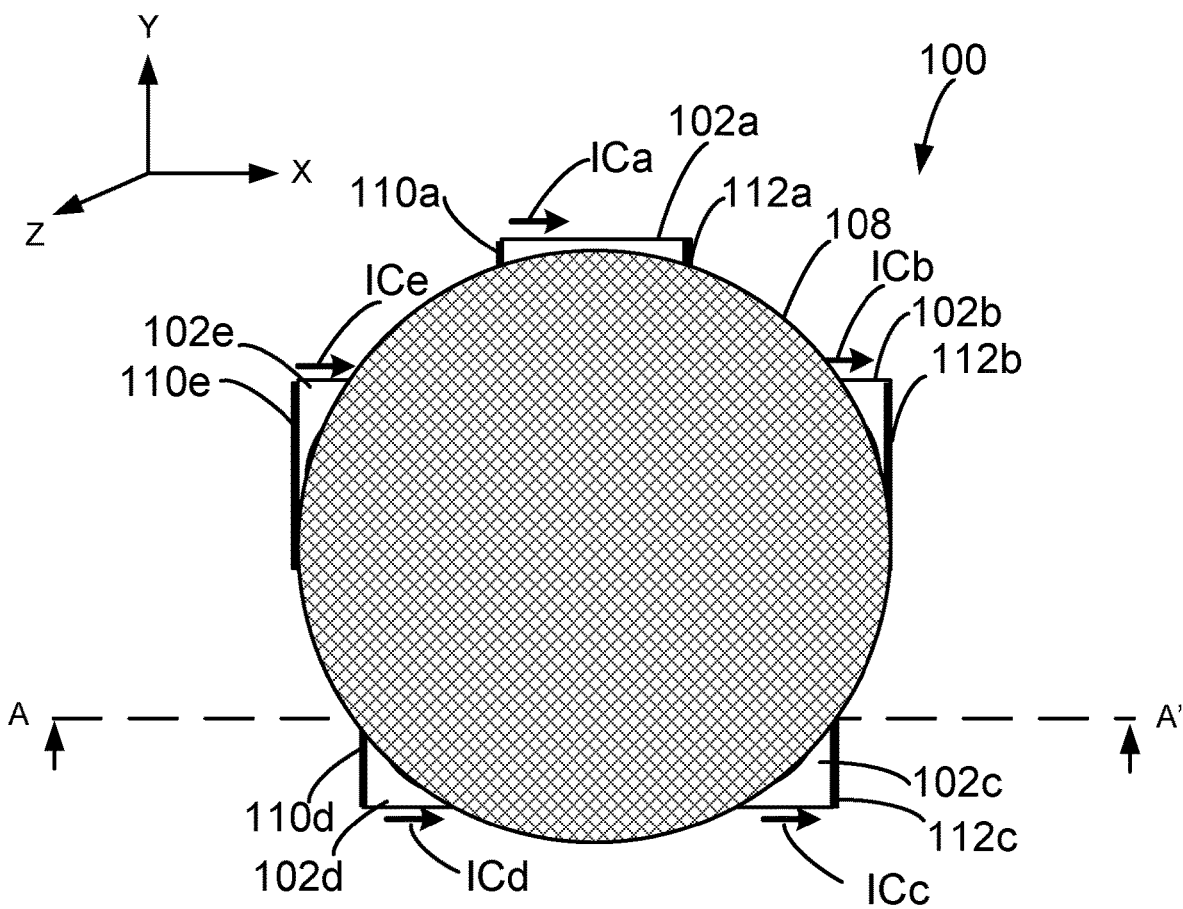
FIGS. 1 and 1A show an example logic device, according to one aspect of the present disclosure.
Figure 1A:
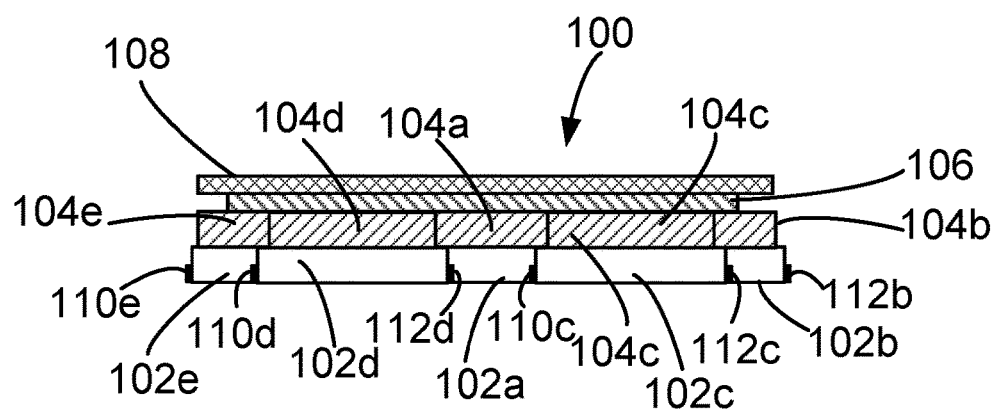

FIG. 1 shows a plan view of an example logic device 100. FIG. 1A shows a cross-sectional view of the logic device 100, along line A-A'. Now, referring to FIGS. 1 and 1A, the logic device 100 includes a plurality of substrates, for example, first substrate 102a, a second substrate 102b, a third substrate 102c, a fourth substrate 102d, and a fifth substrate 102e. The logic device 100 further includes a plurality of input nanomagnets, for example, a first input nanomagnet 104a, a second input nanomagnet 104b, a third input nanomagnet 104c, a fourth input nanomagnet 104d, and a fifth input nanomagnet 104d. The logic device 100 further includes a spacer layer 106, and an output magnet 108.

The first substrate 102a, second substrate 102b, third substrate 102c, fourth substrate 102d, and fifth substrate 102e are conductive metal layers. The first substrate 102a, second substrate 102b, third substrate 102c, fourth substrate 102d, and fifth substrate 102e are substantially made of heavy metal, such as an alloy of β-Tantalum (β-Ta), Platinum (Pt), or β-Tungsten (β-W) or an alloy of heavy metal. In one example, first substrate 102a, second substrate 102b, third substrate 102c, fourth substrate 102d, and fifth substrate 102e are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), or β-Tungsten (β-W). The first substrate 102a, second substrate 102b, third substrate 102c, fourth substrate 102d, and fifth substrate 102e are configured to receive a charge current and convert the charge current into a spin current, through spin Hall effect. For example, the first substrate 102a receives a first charge current ICa, second substrate 102b receives a second charge current ICb, third substrate 102c receives a third charge current ICc, fourth substrate 102d receives a fourth charge current ICd, and the fifth substrate 102e receives a fifth charge current ICe.

The dimensions of first substrate 102a, second substrate 102b, third substrate 102c, fourth substrate 102d, and fifth substrate 102e may be selected so as to have a charge current density of about $7.5e^{12}$ Amperes/meter$^2$ through each of the first substrate 102a, second substrate 102b, third substrate 102c, fourth substrate 102d, and fifth substrate 102e.

In one example, a pair of conductive pads are disposed about opposite sides of the first substrate 102a, second substrate 102b, third substrate 102c, fourth substrate 102d, and fifth substrate 102e so as to selectively pass the charge currents ICa, ICb, ICc, ICd, and ICe respectively, along the X axis. For example, a first conductive pad 110a and a second conductive 112a are disposed about opposite sides of the first substrate 102a. Similarly, first conductive pad 110b and second conductive pad 112b are disposed about the opposite sides of the second substrate 102b. First conductive pad 110c and second conductive pad 112c are disposed about the opposite sides of the third substrate 102c. First conductive pad 110d and second conductive pad 112d are disposed about the opposite sides of the fourth substrate 102d. First conductive pad 110e and second conductive pad 112e are disposed about the opposite sides of the fifth substrate 102e. In one example, the conductive pads are substantially made of Copper or an alloy of Copper. As one skilled in the art appreciates, the direction of the charge current may be selectively changed, by passing the charge current from first conductive pads 110a-110e to second conductive pads 112a-112e (along +X axis) or from second conductive pads 112a-112e to first conductive pads 110a-110e (along −X axis). As one skilled in the art appreciates, the first substrate 102a, second substrate 102b, third substrate 102c, fourth substrate 102d, and fifth substrate 102e may be deposited on a base layer (not shown). Further, first conductive pads 110a-110e, and second conductive pads 112a-112e may be deposited on the base layer. In some examples, base layer may be a silicon wafer.

Figure 1B:
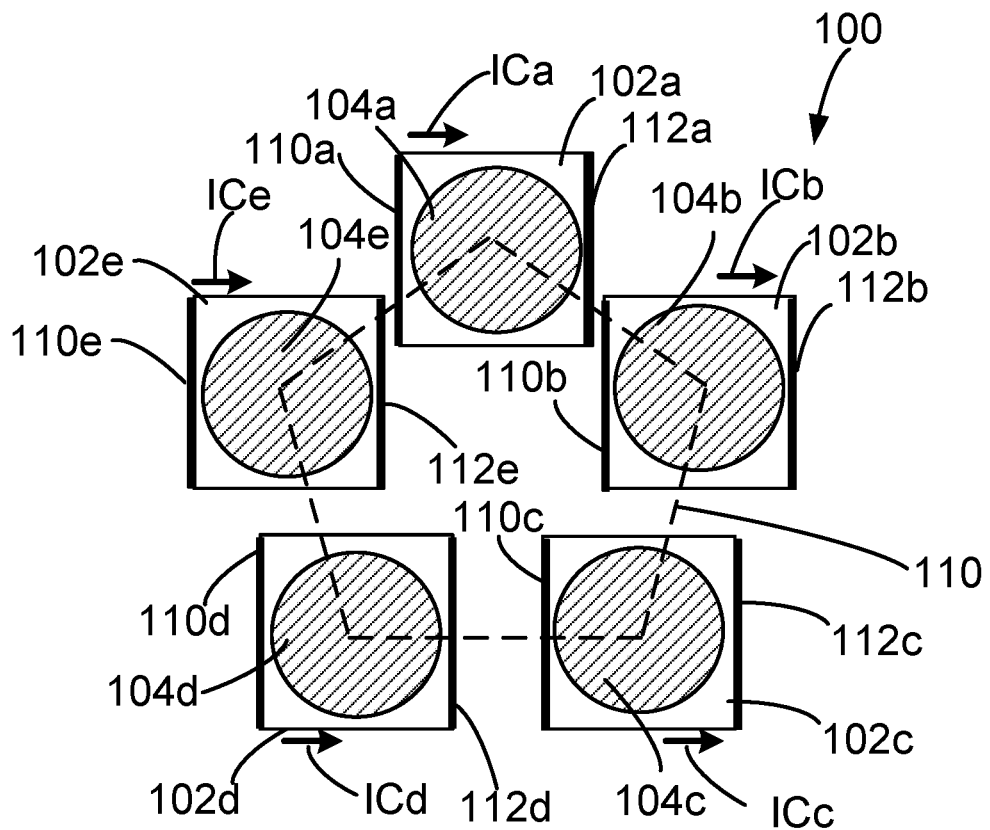
FIG. 1B shows various elements of the logic device of FIG. 1, according to one aspect of the present disclosure.

Now, referring to FIG. 1B, cross-sectional view of the logic device 100, along line A-A' is shown. The line A-A' passes through the center of third nanomagnet 104c and fourth nanomagnet 104d. Referring to FIG. 1B, the first input nanomagnet 104a is disposed over the first substrate 104a, the second input nanomagnet 104b is disposed over the second substrate 102b, the third input nanomagnet 104c is disposed over the third substrate 102c, the fourth input nanomagnet 104d is disposed over the fourth substrate 102d, and the fifth input nanomagnet 104e is disposed over the fifth substrate 102e.

Each of the first input nanomagnet 104a, the second input nanomagnet 104b, the third input nanomagnet 104c, the fourth input nanomagnet 104d, and the fifth input nanomagnet 104e are selectively disposed on the first substrate 102a, second substrate 102b, third substrate 102c, fourth substrate 102d, and fifth substrate 102e respectively, equidistant from each other. In one example, the first input nanomagnet 104a, the second input nanomagnet 104b, the third input nanomagnet 104c, the fourth input nanomagnet 104d, and the fifth input nanomagnet 104e are substantially cylindrical, with a diameter D of about 8 nm. A thickness of the first input nanomagnet 104a, the second input nanomagnet 104b, the third input nanomagnet 104c, the fourth input nanomagnet 104d, and the fifth input nanomagnet 104e are about 3 nm.

The spacer layer 106 is selectively disposed over the first input nanomagnet 104a, second input nanomagnet 104b, the third input nanomagnet 104c, the fourth input nanomagnet 104d, and the fifth input nanomagnet 104e, to substantially cover the first input nanomagnet 104a, second input nanomagnet 104b the third input nanomagnet 104c, the fourth input nanomagnet 104d, and the fifth input nanomagnet 104e. The spacer layer 106 is made of a non-magnetic material. The diameter of the spacer layer 106 is about 20 nm.

The output magnet 108 is selectively disposed over the spacer layer 106. In one example, the output magnet 108 is selectively positioned over the space layer 106 such that the output magnet 108 is subjected to substantially equal effect from the first input nanomagnet 104a, second input magnet 104b, the third input nanomagnet 104c, the fourth input nanomagnet 104d, and the fifth input nanomagnet 104e. In one example, the output magnet 108 is substantially cylindrical, with a diameter D of about 20 nm. In one example, the dimensions and construction of the output magnet 108 is such that it performs as a single domain nanomagnet.

Now, referring to FIG. 1B, in one example, the first input nanomagnet 104a, the second input nanomagnet 104b, the third substrate 102c, the fourth substrate 102d, and the fifth substrate 102e are selectively disposed over the first substrate 102a, second substrate 102b, third substrate 102c, fourth substrate 102d, and fifth substrate 102e respectively, substantially at the vertex of an equilateral pentagon 110. In one example, by selectively disposing the first input nanomagnet 104a, the second input nanomagnet 104b, third substrate 102c, fourth substrate 102d, and fifth substrate 102e at the vertex of an equilateral pentagon 110, all of the first input nanomagnet 104a, the second input nanomagnet 104b, the third input nanomagnet 104c, the fourth input nanomagnet 104d, and the fifth input nanomagnet 104e will have substantially equal contribution to the state of the output nanomagnet 108. In one example, such a selective placement of the input nanomagnets about the vertex of an equilateral pentagon 100 leads to substantially equal magnetization effect on the output nanomagnet 108.

Figure 1C:
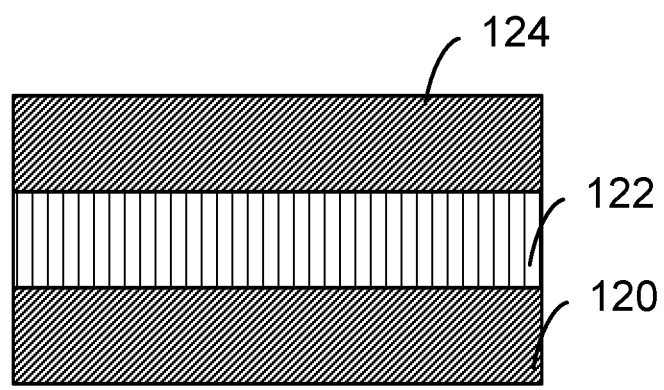
FIG. 1C shows an example input nanomagnet of the logic device of FIG. 1, according to one aspect of the present disclosure.

Now, referring to FIG. 1C, the construction of the first input nanomagnet 104a is described. In one example, construction of second input nanomagnet 104b, the third substrate 102c, the fourth substrate 102d, and the fifth substrate 102e is similar to the construction of the first input nanomagnet 104a. The first input nanomagnet 104a includes a first layer 120, a second layer 122, and a top layer 124. The first layer 120 is composed of a CoFe alloy. The second layer 122 is a Ruthenium (Ru) or an alloy of Ruthenium deposited over the first layer 120. In some examples, the second layer 122 is a Magnesium Oxide (MgO) or an alloy of Magnesium Oxide. And the top layer 124 is a CoFe alloy deposited over the second layer 122. In one example, a thickness of the first layer 120 is about 3 nm. The thickness of the top layer 124 is about 1 nm. The dimensions of the second layer 122 is so chosen so as to maintain a coupling strength J between the first layer 120 and the top layer 124 to be maintained around $J=-1\times10^{-3}$ J/m2. In one example, the thickness of the second layer 122 is about 1 nm. In one example, the dimensions and construction of first input nanomagnet 104a is such that it performs as a single domain nanomagnet.

Having generally described the construction of the logic device 100, example general operation of the logic device 100 will now be described, with reference to FIG. 1. The orientation of the magnetic domain of each of the first input nanomagnet 104a, second input nanomagnet 104b, the third substrate 102c, the fourth substrate 102d, and the fifth substrate 102e are selectively set by passing the first charge current ICa, the second charge current ICb, the third charge current ICc, the fourth charge current ICd, and the fifth charge current ICe, through the first substrate 102a, the second substrate 102b, the third substrate 102c, the fourth substrate 102*d*, and the fifth substrate 102*e*, respectively. The orientation of the magnetic domain of each of the first input nanomagnet 104*a*, second input nanomagnet 104*b*, third input nanomagnet 104*c*, the fourth substrate 102*d*, and the fifth substrate 102*e* depends upon the direction of flow of the first charge current ICa, the second charge current ICb, the third charge current ICc, the fourth charge current ICd, and the fifth charge current ICe.

For example, when the first charge current ICa flows through the first substrate 102*a* in the +X direction, it will inject pure spin current in the Z direction through the spin Hall effect. The direction of current ICa in +X direction results in the electron polarization direction to be pointing along the +Y direction. The magnetization of the first input nanomagnet 104*a* is subjected to the spin injection torque, resulting in induced magnetic direction, indicative of an orientation of the magnetic domain. The direction of the charge current (+X or −X) will determine the orientation of the magnetic domain in the first input nanomagnet 104*a*. As an example, an induced magnetic direction due to first charge current ICa in the +X direction may indicate a logical value of 0, and an induced magnetic direction due to first charge current ICa in the −X direction may indicate a logical value of 1.

Similarly, when the second charge current ICb flows through the second substrate 102*b* in the +X direction, it will inject pure spin current in the Z direction through the spin Hall effect. The direction of current ICb in the +X direction results in the electron polarization direction to be pointing along the +Y direction. The direction of the charge current (+X or −X) will determine the orientation of the magnetic domain in the second input nanomagnet 104*b*. As an example, an induced magnetic direction due to second charge current ICb in the +X direction may indicate a logical value of 0, and an induced magnetic direction due to second charge current ICb in the −X direction may indicate a logical value of 1.

Similarly, when the third charge current ICc flows through the third substrate 102*c* in the +X direction, it will inject pure spin current in the Z direction through the spin Hall effect. The direction of current ICc in the +X direction results in the electron polarization direction to be pointing along the +Y direction. The direction of the charge current (+X or −X) will determine the orientation of the magnetic domain in the third input nanomagnet 104*c*. As an example, an induced magnetic direction due to third charge current ICc in the +X direction may indicate a logical value of 0, and an induced magnetic direction due to third charge current ICc in the −X direction may indicate a logical value of 1.

Similarly, when the fourth charge current ICd flows through the fourth substrate 102*d* in the +X direction, it will inject pure spin current in the Z direction through the spin Hall effect. The direction of current ICd in the +X direction results in the electron polarization direction to be pointing along the +Y direction. The direction of the charge current (+X or −X) will determine the orientation of the magnetic domain in the fourth input nanomagnet 104*d*. As an example, an induced magnetic direction due to fourth charge current ICd in the +X direction may indicate a logical value of 0, and an induced magnetic direction due to fourth charge current ICd in the −X direction may indicate a logical value of 1.

Similarly, when the fifth charge current ICe flows through the fifth substrate 102*e* in the +X direction, it will inject pure spin current in the Z direction through the spin Hall effect. The direction of current ICe in the +X direction results in the electron polarization direction to be pointing along the +Y direction. The direction of the charge current (+X or −X) will determine the orientation of the magnetic domain in the fifth input nanomagnet 104*e*. As an example, an induced magnetic direction due to fifth charge current ICe in the +X direction may indicate a logical value of 0, and an induced magnetic direction due to fifth charge current ICe in the −X direction may indicate a logical value of 1.

The state of the first input nanomagnet 104*a*, second input nanomagnet 104*b*, third input nanomagnet 104*c*, the fourth input nanomagnet 104*d*, and the fifth input nanomagnet 104*e* are selectively set due to spin torque effect by the first charge current ICa flowing through the first substrate 102*a*, the second charge current ICb flowing through the second substrate 102*b*, the third charge current ICc flowing through the third substrate 102*c*, the fourth charge current ICd flowing through the fourth substrate 102*d*, and the fifth charge current ICe flowing through the fifth substrate 102*e*. The resultant interaction of the first input nanomagnet 104*a*, second nanomagnet 104*b*, third input nanomagnet 104*c*, the fourth input nanomagnet 104*d*, and the fifth input nanomagnet 104*e* gets antiferromagnetically exchange coupled to the output nanomagnet 108, through the spacer layer 106. In one example, due to the strong exchange interaction arising from the interlayer exchange coupling between the input nanomagnets and the output nanomagnet through the spacer layer, a stable and reliable nanomagnetic device is realized.

In one example, charge current flowing through the first substrate 102*a*, second substrate 102*b*, third input nanomagnet 104*c*, the fourth substrate 102*d*, and the fifth substrate 102*e* produce a spin orbit torque, in each of the first substrate 102*a*, second substrate 102*b*, and third substrate 102*c*, the fourth substrate 102*d*, and the fifth substrate 102*e*. The generated spin orbit torque drives the orientation of the magnetic field in the first input nanomagnet 104*a*, second nanomagnet 104*b*, third input nanomagnet 104*c*, the fourth input nanomagnet 104*d*, and the fifth input nanomagnet 104*e* respectively. The output magnet 108 separated by the spacer layer 106 obtains an antiferromagnetic coupling from the first input nanomagnet 104*a*, second nanomagnet 104*b*, third input nanomagnet 104*c*, the fourth input nanomagnet 104*d*, and the fifth input nanomagnet 104*e*, where the output magnet 108 is interlayer exchange coupled with the first input nanomagnet 104*a*, second nanomagnet 104*b*, third input nanomagnet 104*c*, the fourth input nanomagnet 104*d*, and the fifth input nanomagnet 104*e*. As the output magnet 108 is a single domain nanomagnet, the inverted majority of the state of the first input nanomagnet 104*a*, second nanomagnet 104*b*, third input nanomagnet 104*c*, the fourth input nanomagnet 104*d*, and the fifth input nanomagnet 104*e* determine the state of the output magnet 108.

Now, referring to FIG. 1C, example construction of the first input nanomagnet 104*a* is described. In one example, construction of second input nanomagnet 104*b*, third input nanomagnet 104*c*, fourth input nanomagnet 104*d*, and fifth input nanomagnet 104*e* are similar to the construction of the first input nanomagnet 104*a*. The first input nanomagnet 104*a* includes a first layer 120, a second layer 122, and a top layer 124. The first layer 120 is composed of a CoFe alloy. The second layer 122 is a Ruthenium (Ru) or an alloy of Ruthenium deposited over the first layer 120. And the top layer 124 is a CoFe alloy deposited over the second layer 122. In one example, a thickness of the first layer 120 is about 2-5 nm. The thickness of the top layer 124 is of the order of about 1 nm. The dimensions of the second layer 122 is so chosen so as to maintain a coupling strength J between the first layer 120 and the top layer 124 to be maintained around $J=-1\times10^{-3}$ J/m2. In one example, the thickness of the second layer 122 is of the order of about 1 nm. In one example, the dimensions and construction of first input nanomagnet 104a is such that it performs as a single domain nanomagnet.

Figure 2:
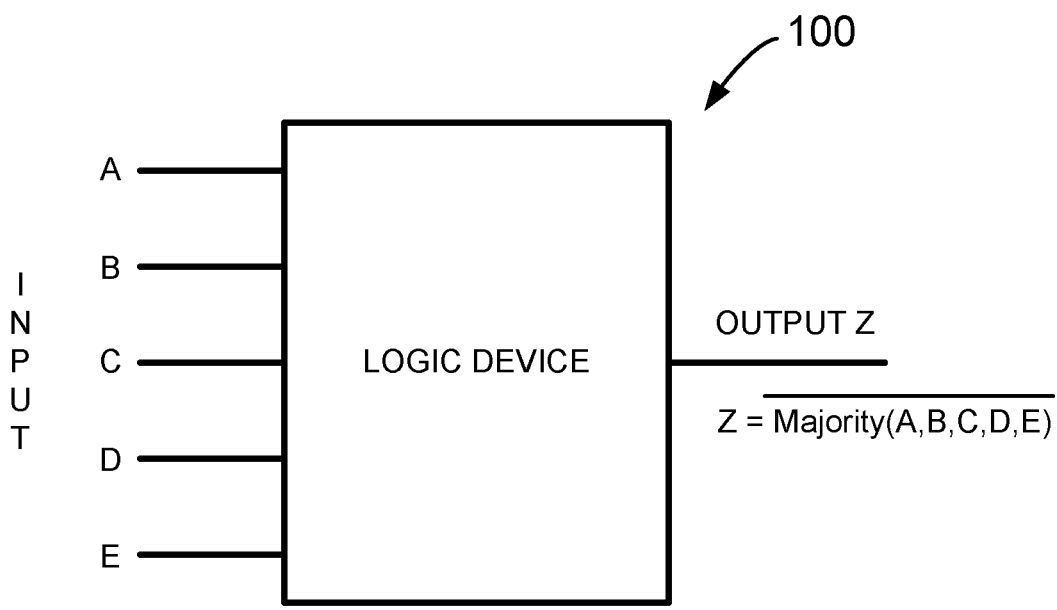
FIG. 2 shows an example block diagram of the logic device, according to one aspect of the present disclosure.

Now, referring to FIG. 2, an example block diagram of the logic device 100 is shown. In this example, the logic device 100 includes five inputs A, B, C, D, and E. The Output of the logic device is shown as Z. In one example, the output Z of the logic device 100 is equal to the inverted majority of the inputs A, B, C, D, E as the output nanomagnet is antiferromagnetically coupled to the input nanomagnets. Various combinations of the inputs A, B, C, D, E and the corresponding output Z is shown in FIGS. 3A and 3B.

Now, referring to FIG. 3A, an example table 300 is shown. Table 300 shows various inputs (A, B, C, D, E) to the logic device and corresponding output (Z) of the logic device implemented as a NAND logic. Column 302 shows various inputs to the first input nanomagnet 104a, the second input nanomagnet 104b, the third input nanomagnet 104c, the fourth input nanomagnet 104d, and the fifth input nanomagnet 104e. Column 304 shows various outputs of the output magnet 108, based on various inputs. Column 306 shows the logic type, in this case, a NAND logic. Rows 308 to 338 show various inputs and corresponding outputs of the logic device, implementing a NAND logic. In this example, we notice that the when the input A is set as zero along with any other input also set to 0 or otherwise any two inputs are set at zero, three input NAND operation is performed on the rest of the three inputs and the result is obtained at the output nanomagnet. For example, referring to row 308, we notice that majority of the inputs are set to zero (in this case, all the inputs are set to zero) and the output value is a one. Likewise, rows 310, 312, 314, 316, 318, 320, 324, 326, 328, 332 and 338 have majority of the inputs set to zero and the corresponding output value is a one. Similarly, referring to row 322, we notice that majority of the inputs are set to one (in this case, three inputs are set to one) and the output value is a zero. Likewise, rows 330, 334 336, have majority of the inputs set as one and the corresponding output value is a zero.

Now, referring to FIG. 3B, another example table 350 is show. Table 350 shows various inputs (A, B, C, D, E) to the logic device and corresponding output (Z) of the logic device implemented as a NOR logic. Column 352 shows various inputs to the first input nanomagnet 104a, the second input nanomagnet 104b, the third input nanomagnet 104c, the fourth input nanomagnet 104d, and the fifth input nanomagnet 104e. Column 354 shows various outputs of the output magnet 108, based on various inputs. Column 356 shows the logic type, in this case, a NOR logic. Rows 358 to 388 show various inputs and corresponding outputs of the logic device, implementing a NOR logic. In this example, we notice that the when the first input nanomagnet is set as 1, along with another input also set as 1 input or otherwise any two input nanomagnets set at logic 1, resulting in NOR operation at the output nanomagnet depending on the rest of the three inputs for the five inputs majority gate. And, the outputs corresponds to the three input NOR operation based on majority of the five inputs. For example, referring to row 388, we notice that majority of the inputs are set to one and the output value is a zero, that is the inverted majority output indicative of a NOR operation. Likewise, rows 360, 362, 366, and 374 have majority of the inputs set to zero and the corresponding output value is a one. Similarly, referring to row 364, we notice that majority of the inputs are set to one (in this case, three inputs are set to one) and the output value is a zero. Likewise, rows 358, 368, 370, 372, 376, 378, 380, 382, 384, 386, and 388 have majority of the inputs set as one and the corresponding output value is a zero.

Having described the logical operation of the logic device as a majority input NAND logic (three input NAND operation) or a majority input NOR logic (three input NOR operation), selective interactions due to different magnetic domain polarization of the first input nanomagnet 104a, second nanomagnet 104b, third input nanomagnet 104c, the fourth input nanomagnet 104d, and the fifth input nanomagnet 104e is now explained.

Figure 4A:
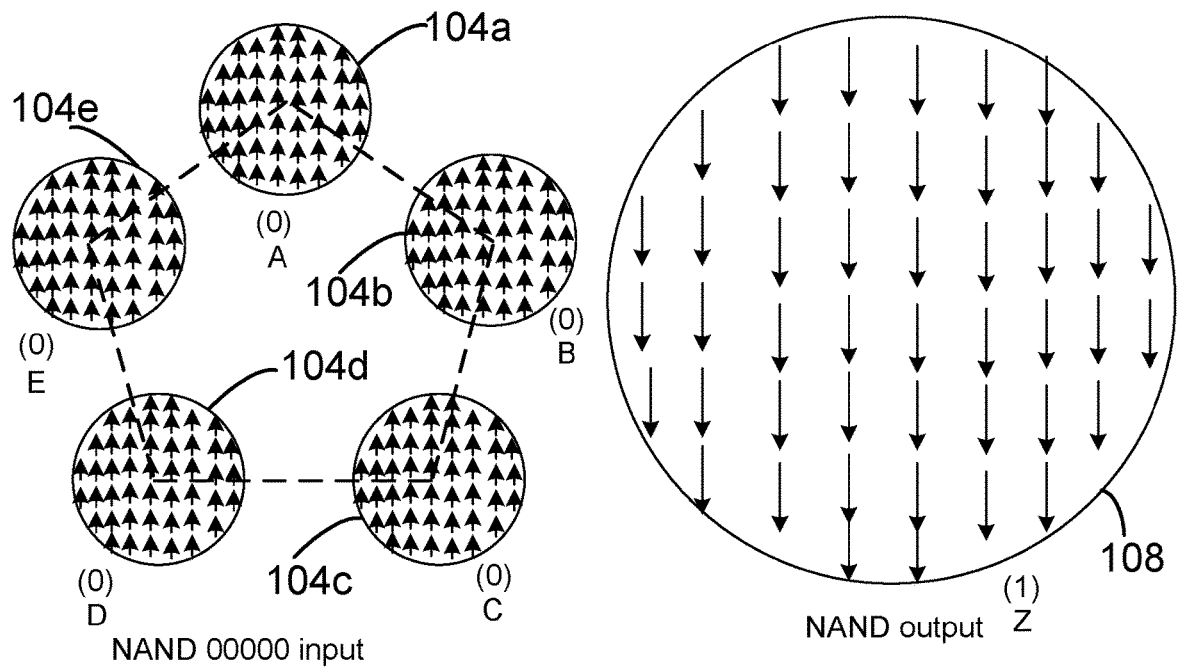
FIGS. 4A, and 4B show example inputs and corresponding output states of the logic device implementing the logic device as a NAND logic, according to one aspect of the present disclosure.
Figure 4B:
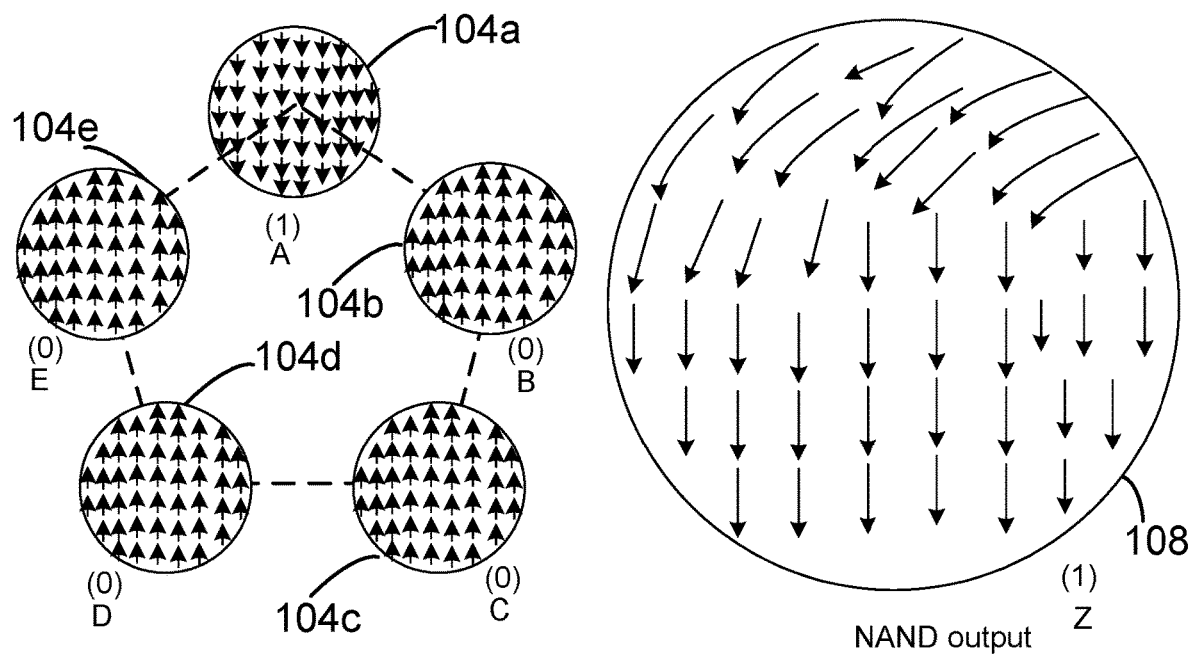

FIGS. 4A, and 4B represent an example implementation of a NAND logic. In this example, the direction of one of the charge currents, for example, the first charge current ICa is selected to indicate a value of 0, and the direction of the other charge currents, for example, direction of second charge current ICb, third charge current ICc, fourth charge current ICd, and fifth charge current ICe are selectively changed to set various inputs to the logic device, and getting corresponding outputs indicative of a NAND logic.

Now, referring to FIG. 4A, first input nanomagnet 104a, second nanomagnet 104b, third input nanomagnet 104c, fourth input nanomagnet 104d, fifth input nanomagnet 104e, and output magnet 108 are shown. In this example, the direction of first charge current ICa is selected to indicate a value of 0, which is shown with magnetic spins pointing upwards in the first input nanomagnet 104a. This will generate an antiferromagnetic state with the spins pointing downwards in the output magnet 108. Similarly, the direction of second charge current ICb is selected to indicate a value of 0, which is shown with magnetic spins pointing upwards in the second input nanomagnet 104b. This will generate an antiferromagnetic state with the spins pointing downwards in the output magnet 108. Similarly, the direction of third charge current ICc is selected to indicate a value of 0, which is shown with magnetic spins pointing upwards in the third input nanomagnet 104c. This will generate an antiferromagnetic state with the spins pointing downwards in the output magnet 108.

Similarly, the direction of fourth charge current ICd is selected to indicate a value of 0, which is shown with magnetic spins pointing upwards in the fourth input nanomagnet 104d. This will generate an antiferromagnetic state with the spins pointing downwards in the output magnet 108. Similarly, the direction of fifth charge current ICe is selected to indicate a value of 0, which is shown with magnetic spins pointing upwards in the fifth input nanomagnet 104e. This will generate an antiferromagnetic state with the spins pointing downwards in the output magnet 108. Based on the direction of magnetic spins in the output magnet 108 will together result in a total magnetic spin pointing downwards.

As the output magnet 108 is a single domain nanomagnet, the majority of the state of the first input nanomagnet 104a, second input nanomagnet 104b, third input nanomagnet 104c, fourth input nanomagnet 104d, and fifth input nanomagnet 104e determine the state of the output magnet 108. As the magnetic spin pointing upwards was indicative of a value of 0, the magnetic spin pointing downwards will indicate a value of 1. In other words, in this example, the input to the logic device due to second input nanomagnet 102b, third input nanomagnet 102c, fourth input nanomagnet 102d, and fifth input nanomagnet 102e was {0,0,0,0} and the output was {1}. As one skilled in the art appreciates, this is indicative of a NAND operation. This result corresponds to the result shown in row 308 of table 300 of FIG. 3A.

Now, referring to FIG. 4B, first input nanomagnet 104a, second nanomagnet 104b, third input nanomagnet 104c, fourth input nanomagnet 104d, fifth input nanomagnet 104e, and output magnet 108 are shown. In this example, the direction of first charge current ICa is selected to indicate a value of 1, which is shown with magnetic spins pointing downwards in the first input nanomagnet 104a. This will generate an antiferromagnetic state with the spins pointing upwards in the output magnet 108. On the other hand, the direction of second charge current ICb is selected to indicate a value of 0, which is shown with magnetic spins pointing upwards in the second input nanomagnet 104b. This will generate an antiferromagnetic state with the spins pointing downwards in the output magnet 108. Similarly, the direction of third charge current ICc is selected to indicate a value of 0, which is shown with magnetic spins pointing upwards in the third input nanomagnet 104c. This will generate an antiferromagnetic state with the spins pointing downwards in the output magnet 108.

Similarly, the direction of fourth charge current ICd is selected to indicate a value of 0, which is shown with magnetic spins pointing upwards in the fourth input nanomagnet 104d. This will generate an antiferromagnetic state with the spins pointing downwards in the output magnet 108. Similarly, the direction of fifth charge current ICe is selected to indicate a value of 0, which is shown with magnetic spins pointing upwards in the fifth input nanomagnet 104e. This will generate an antiferromagnetic state with the spins pointing downwards in the output magnet 108. Based on the direction of magnetic spins in the output magnet 108 will together result in a total magnetic spin pointing downwards.

As the output magnet 108 is a single domain nanomagnet, the majority of the state of the first input nanomagnet 104a, second input nanomagnet 104b, third input nanomagnet 104c, fourth input nanomagnet 104d, and fifth input nanomagnet 104e determine the state of the output magnet 108. The magnetic spin pointing downward is indicative of a value of 1. In other words, in this example, the input to the logic device due to second input nanomagnet 102b, third input nanomagnet 102c, fourth input nanomagnet 102d, and fifth input nanomagnet 102e was {1,0,0,0} and the output was {1}. As one skilled in the art appreciates, this is indicative of a NAND operation. This result corresponds to the result shown in row 338 of table 300 of FIG. 3A.

Figure 4C:
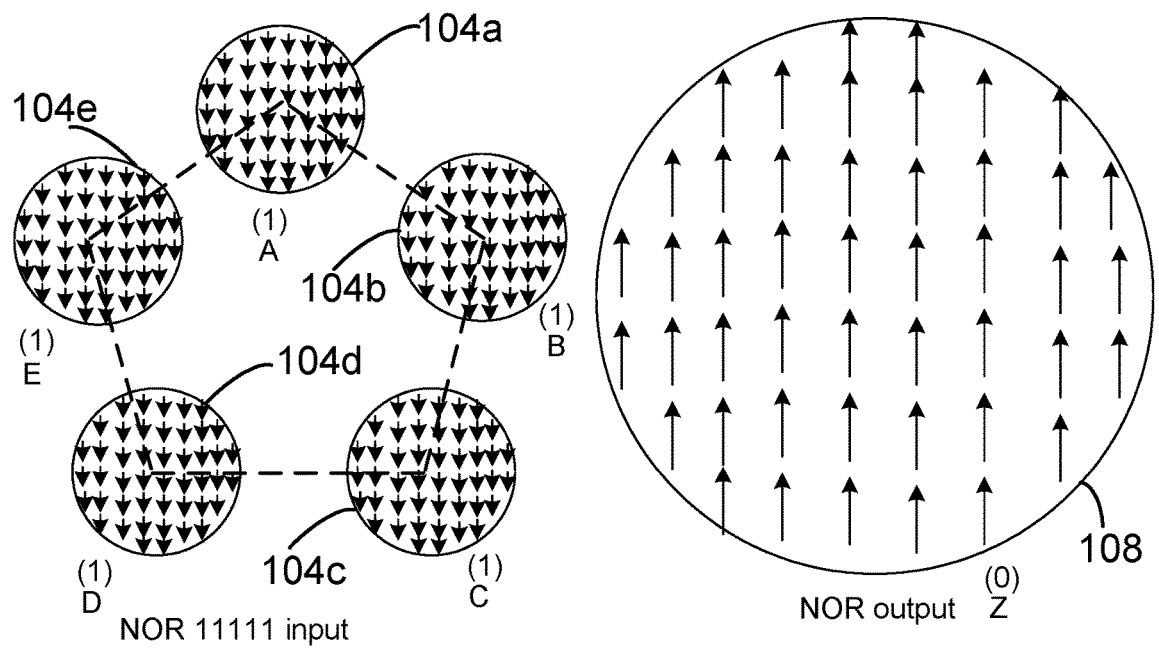
FIGS. 4C, and 4D show example inputs and corresponding output states of the logic device implementing the logic device as a NOR logic, according to one aspect of the present disclosure.
Figure 4D:
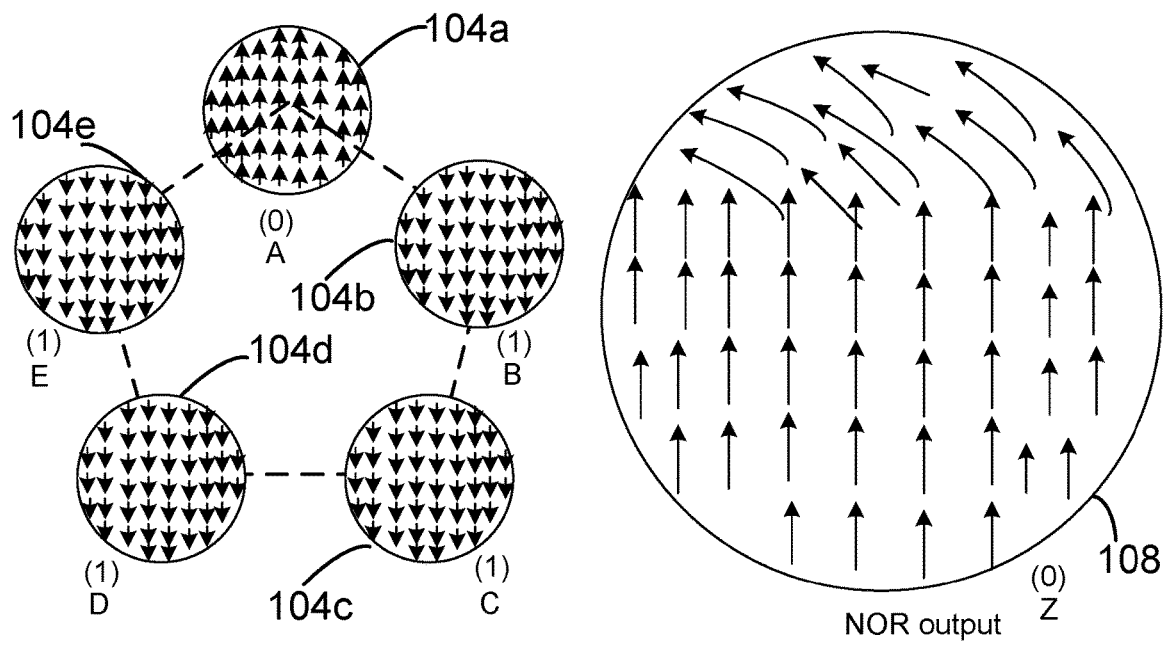

FIGS. 4C, and 4D represent an example implementation of a NOR logic. In this example, the direction of one of the charge currents, for example, the first charge current ICa is selected to indicate a value of 1, and the direction of the other charge currents, for example, direction of second charge current ICb, third charge current ICc, fourth charge current ICd, and fifth charge current ICe are selectively changed to set various inputs to the logic device, and getting corresponding outputs indicative of a NOR logic, for example, as shown in table 350 of FIG. 3B.

Now, referring to FIG. 4C, first input nanomagnet 104a, second nanomagnet 104b, third input nanomagnet 104c, fourth input nanomagnet 104d, fifth input nanomagnet 104e, and output magnet 108 are shown. In this example, the direction of first charge current ICa is selected to indicate a value of 1, which is shown with magnetic spins pointing downwards in the first input nanomagnet 104a. This will generate an antiferromagnetic state with the spins pointing upwards in the output magnet 108. Similarly, the direction of second charge current ICb is selected to indicate a value of 1, which is shown with magnetic spins pointing downwards in the second input nanomagnet 104b. This will generate an antiferromagnetic state with the spins pointing upwards in the output magnet 108. Similarly, the direction of third charge current ICc is selected to indicate a value of 1, which is shown with magnetic spins pointing downwards in the third input nanomagnet 104c. This will generate an antiferromagnetic state with the spins pointing upwards in the output magnet 108.

Similarly, the direction of fourth charge current ICd is selected to indicate a value of 1, which is shown with magnetic spins pointing downwards in the fourth input nanomagnet 104d. This will generate an antiferromagnetic state with the spins pointing upwards in the output magnet 108. Similarly, the direction of fifth charge current ICe is selected to indicate a value of 1, which is shown with magnetic spins pointing downwards in the fifth input nanomagnet 104e. This will generate an antiferromagnetic state with the spins pointing upwards in the output magnet 108. Based on the direction of magnetic spins in the output magnet 108 will together result in a total magnetic spin pointing upwards.

As the output magnet 108 is a single domain nanomagnet, the majority of the state of the first input nanomagnet 104a, second input nanomagnet 104b, third input nanomagnet 104c, fourth input nanomagnet 104d, and fifth input nanomagnet 104e determine the state of the output magnet 108. The magnetic spin pointing upwards is indicative of a value of 0. In other words, in this example, the input to the logic device due to second input nanomagnet 102b, third input nanomagnet 102c, fourth input nanomagnet 102d, and fifth input nanomagnet 102e was {1,1,1,1} and the output was {0}. As one skilled in the art appreciates, this is indicative of a NOR operation. This result corresponds to the result shown in row 388 of table 350 of FIG. 3B.

Now, referring to FIG. 4D, first input nanomagnet 104a, second nanomagnet 104b, third input nanomagnet 104c, fourth input nanomagnet 104d, fifth input nanomagnet 104e, and output magnet 108 are shown. In this example, the direction of first charge current ICa is selected to indicate a value of 0, which is shown with magnetic spins pointing upwards in the first input nanomagnet 104a. This will generate an antiferromagnetic state with the spins pointing downwards in the output magnet 108. On the other hand, the direction of second charge current ICb is selected to indicate a value of 1, which is shown with magnetic spins pointing downwards in the second input nanomagnet 104b. This will generate an antiferromagnetic state with the spins pointing upwards in the output magnet 108. Similarly, the direction of third charge current ICc is selected to indicate a value of 1, which is shown with magnetic spins pointing downwards in the third input nanomagnet 104c. This will generate an antiferromagnetic state with the spins pointing upwards in the output magnet 108.

Similarly, the direction of fourth charge current ICd is selected to indicate a value of 1, which is shown with magnetic spins pointing downwards in the fourth input nanomagnet 104d. This will generate an antiferromagnetic state with the spins pointing upwards in the output magnet 108. Similarly, the direction of fifth charge current ICe is selected to indicate a value of 1, which is shown with magnetic spins pointing downwards in the fifth input nanomagnet 104e. This will generate an antiferromagnetic state with the spins pointing upwards in the output magnet 108. Based on the direction of magnetic spins in the output magnet 108 will together result in a total magnetic spin pointing upwards.

As the output magnet 108 is a single domain nanomagnet, the majority of the state of the first input nanomagnet 104a, second input nanomagnet 104b, third input nanomagnet 104c, fourth input nanomagnet 104d, and fifth input nanomagnet 104e determine the state of the output magnet 108. As the magnetic spin pointing downward was indicative of a value of 1, the magnetic spin pointing upwards will indicate a value of 1. In other words, in this example, the input to the logic device due to second input nanomagnet 102b, third input nanomagnet 102c, fourth input nanomagnet 102d, and fifth input nanomagnet 102e was {1,1,1,1} and the output was {0}. As one skilled in the art appreciates, this is indicative of a NOR operation. This result corresponds to the result shown in row 358 of table 350 of FIG. 3B.

As one skilled in the art appreciate, a suitable sensor may be operatively disposed relative to the output magnet 108 to selectively measure the magnetic orientation of the output magnet 108, to determine a polarity of the magnetic domain, thereby determining a value of 0 or 1.

Figure 5:
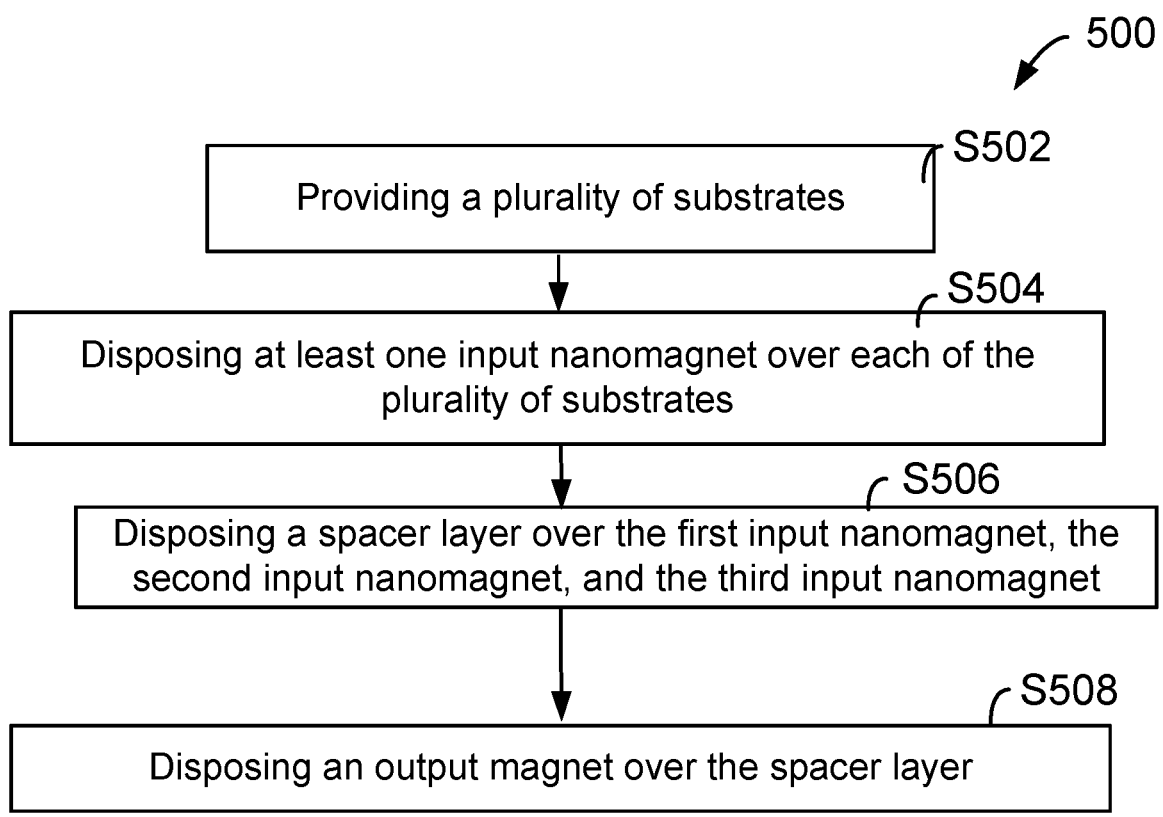
FIG. 5 shows an example flow diagram, according to one aspect of the present disclosure.

Now, referring to FIG. 5, an example flow diagram 500 is described. In block S502, a plurality of substrates are provided. For example, first substrate 102a, second substrate 102b, third substrate 102c, fourth substrate 102d, and fifth substrate 102e are provided.

In block S504, at least one input nanomagnet is disposed over each of the plurality of substrates. For example, a first input nanomagnet 104a is disposed over the first substrate 102a, a second input nanomagnet 104b is disposed over the second substrate 102b, a third input nanomagnet 104c is disposed over the third substrate 102c, a fourth input nanomagnet 104d is disposed over the fourth substrate 102d, and a fifth input nanomagnet 104e is disposed over the fifth substrate 102e.

In block S506, a spacer layer is disposed over the plurality of input nanomagnets. For example, a spacer layer 106 is disposed over the first input nanomagnet 104a, the second input nanomagnet 104b, the third input nanomagnet 104c, the fourth input nanomagnet 104d, and the fifth input nanomagnet 104e.

In block S508, an output magnet is disposed over the spacer layer. For example, an output magnet 108 is disposed over the spacer layer 106.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
   providing a plurality of substrates;
   disposing at least one input nanomagnet over each of the plurality of substrate,
   wherein, the plurality of input nanomagnets are disposed substantially equidistant from each other, and
   wherein, each of the plurality of input nanomagnets are each a single domain nanomagnet;
   disposing a spacer layer over the plurality of input nanomagnets; and
   disposing an output magnet over the spacer layer, wherein, the output magnet is a single domain nanomagnet,
   wherein there are at least five substrates, and each of the input nanomagnet disposed over the at least five substrates are centrally disposed about each vertex of an equilateral pentagon.

2. The method of claim 1, further including selectively passing a charge current through each of the plurality of substrates, and based on a direction of the charge current, a direction of orientation of the plurality of input nanomagnets are selectively set.

3. The method of claim 2, wherein the direction of orientation of the plurality of input nanomagnets cumulatively set a direction of orientation of the output magnet.

4. The method of claim 3, further including:
   changing the direction of orientation of the output magnet, by selectively changing direction of current flow of one or more of the charge current.

5. The method of claim 3, wherein the plurality of input nanomagnets, each have a first direction of orientation and a second direction of orientation, with the first direction of orientation substantially opposite to the second direction of orientation, wherein, the first direction of orientation is indicative of a zero, and the second direction of orientation is indicative of a one.

6. The method of claim 5, wherein,
   when a majority of the plurality of input nanomagnets have an orientation in the first direction, the direction of orientation of the output magnet is substantially in the second direction of orientation.

7. The method of claim 1, wherein,
   when a majority of the plurality of input nanomagnets have an orientation in the second direction, the direction of orientation of the output magnet is substantially in the first direction of orientation.

8. The method of claim 1, wherein,
   a diameter of the plurality of input nanomagnets are of the order of about 8 nm; and
   a diameter of the output magnet is of the order of about 20 nm.

9. The method of claim 1, wherein, the plurality of substrates are each composed of a heavy metal,
   wherein, the charge currents through the plurality of substrates produce a spin orbit torque in each of the plurality of substrates and drive an orientation of magnetic field in the plurality of corresponding input nanomagnets; and
   the output magnet separated by the spacer layer obtains an antiferromagnetic coupling from the plurality of input nanomagnets.

10. A logic device, including:
    a plurality of substrates;
    at least one input nanomagnet disposed over each of the plurality of substrate,
    wherein, the plurality of input nanomagnets are disposed substantially equidistant from each other, and
    wherein, each of the plurality of input nanomagnets are each a single domain nanomagnet;
    a spacer layer disposed over the plurality of input nanomagnets; and
    an output magnet disposed over the spacer layer, wherein, the output magnet is a single domain nanomagnet,
    wherein there are at least five substrates, and each of the input nanomagnet disposed over the at least five substrates are centrally disposed about each vertex of an equilateral pentagon.

11. The device of claim 10, wherein, a charge current is selectively passed through each of the plurality of substrates, and based on a direction of the charge current, a direction of orientation of the plurality of input nanomagnets are selectively set.

12. The device of claim 11, wherein the direction of orientation of the plurality of input nanomagnets cumulatively set a direction of orientation of the output magnet.

13. The device of claim 12, wherein, the direction of orientation of the output magnet is changed by selectively changing direction of current flow of one or more of the charge current.

14. The device of claim 12, wherein the plurality of input nanomagnets, each have a first direction of orientation and a second direction of orientation, with the first direction of orientation substantially opposite to the second direction of orientation, wherein, the first direction of orientation is indicative of a zero, and the second direction of orientation is indicative of a one.

15. The device of claim 14, wherein,
when a majority of the plurality of input nanomagnets have an orientation in the first direction, the direction of orientation of the output magnet is substantially in the second direction of orientation.

16. The device of claim 14, wherein,
when a majority of the plurality of input nanomagnets have an orientation in the second direction, the direction of orientation of the output magnet is substantially in the first direction of orientation.

17. The device of claim 10, wherein,
a diameter of the plurality of input nanomagnets are of the order of about 8 nm; and
a diameter of the output magnet is of the order of about 20 nm.

18. The device of claim 10, wherein, the plurality of substrates are each composed of a heavy metal,
wherein, the charge currents through the plurality of substrates produce a spin orbit torque in each of the plurality of substrates and drive an orientation of magnetic field in the plurality of corresponding input nanomagnets; and
the output magnet separated by the spacer layer obtains an antiferromagnetic coupling from the plurality of input nanomagnets.

* * * * *